United States Patent
Sugiyama et al.

(10) Patent No.: US 9,363,897 B2
(45) Date of Patent: Jun. 7, 2016

(54) SUBSTRATE WITH BUILT-IN ELECTRONIC COMPONENT

(71) Applicant: Taiyo Yuden Co., Ltd., Tokyo (JP)

(72) Inventors: Yuichi Sugiyama, Tokyo (JP); Tatsuro Sawatari, Tokyo (JP); Yusuke Inoue, Tokyo (JP); Masashi Miyazaki, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/133,372

(22) Filed: Dec. 18, 2013

(65) Prior Publication Data

US 2014/0307402 A1  Oct. 16, 2014

(30) Foreign Application Priority Data

Apr. 12, 2013  (JP) .................................. 2013-083973
Sep. 4, 2013  (JP) .................................. 2013-182818

(51) Int. Cl.
*H05K 1/18* (2006.01)
*H05K 1/02* (2006.01)
(Continued)

(52) U.S. Cl.
CPC ................ *H05K 1/183* (2013.01); *H01L 24/19* (2013.01); *H05K 1/0298* (2013.01); *H05K 1/185* (2013.01);
(Continued)

(58) Field of Classification Search
CPC ...... H01L 24/19; H05K 1/0298; H05K 1/183; H05K 1/185; H05K 2201/0209; H05K 2201/068; H05K 2201/10636; H05K 2203/1469; H05K 3/4602

USPC ........... 174/260–262; 361/760–761, 792–795
See application file for complete search history.

(56) References Cited

U.S. PATENT DOCUMENTS 8,536,959 B1 * 9/2013 Mugiya et al. ................ 333/186
8,780,573 B2 * 7/2014 Inagaki et al. ................ 361/766
(Continued)

FOREIGN PATENT DOCUMENTS

JP  2009-302563 A  12/2009
JP  2010-114434 A  5/2010
(Continued)

OTHER PUBLICATIONS

Office Action issued in corresponding Japanese Application No. 2013-182818 dated Dec. 25, 2013 and English translation of the same (6 pages).

(Continued)

*Primary Examiner* — Jenny L Wagner
*Assistant Examiner* — Ahmad D Barnes
(74) *Attorney, Agent, or Firm* — Fitch Even Tabin & Flannery LLP (57) ABSTRACT

Provided is a substrate with built-in electronic component including a component storage layer and two buildup layers. The component storage layer includes an electronic component and a cover portion having an insulating property. The electronic component includes a terminal surface and a main body. The cover portion includes a first surface formed to be flush with the terminal surface, covers the main body of the electronic component, and has a first linear expansion coefficient. The two buildup layers each include an insulating layer and a via portion. The insulating layer is adjacent to the cover portion and has a second linear expansion coefficient larger than the first linear expansion coefficient. The via portion is provided in the insulating layer and connected to the terminal surface. The insulating layer of one of the two buildup layers is formed to be in contact with the terminal surface and the first surface.

8 Claims, 3 Drawing Sheets

(51) Int. Cl.
*H01L 23/00* (2006.01)
*H05K 3/46* (2006.01)

(52) U.S. Cl.
CPC ..... *H01L 2924/12042* (2013.01); *H05K 3/4602* (2013.01); *H05K 2201/0209* (2013.01); *H05K 2201/068* (2013.01); *H05K 2201/10636* (2013.01); *H05K 2203/1469* (2013.01); *Y02P 70/611* (2015.11)

(56) References Cited

U.S. PATENT DOCUMENTS

| | | | | |
|---|---|---|---|---|
| 2009/0084596 | A1* | 4/2009 | Inoue et al. | 174/261 |
| 2010/0084175 | A1* | 4/2010 | Suzuki et al. | 174/260 |
| 2011/0203836 | A1* | 8/2011 | Yokota et al. | 174/250 |
| 2014/0048321 | A1* | 2/2014 | Sugiyama et al. | 174/260 |
| 2014/0049928 | A1* | 2/2014 | Sawatari et al. | 361/762 |

FOREIGN PATENT DOCUMENTS

| | | |
|---|---|---|
| JP | 2011-029623 A | 2/2011 |
| JP | 2011-187831 A | 9/2011 |

OTHER PUBLICATIONS

Office Action issued in Japanese Application No. 2013-182818 dated Sep. 30, 2013 and English translation of the same (5 pages).

* cited by examiner

SUBSTRATE WITH BUILT-IN ELECTRONIC COMPONENT

CROSS-REFERENCE TO RELATED APPLICATIONS

This application claims priority under 35 U.S.C. §119 to Japanese Patent Application No. 2013-083973, filed on Apr. 12, 2013, and Japanese Application No. 2013-182818, filed on Sep. 4, 2013, the entire content of which are hereby incorporated herein by reference in their entirety.

FIELD

The present disclosure relates to a substrate with built-in electronic component having a multilayer structure, in which an electronic component is incorporated.

BACKGROUND

In a substrate with built-in electronic component, generally, in an insulating material formed on an electronic component, a via portion for connection with a terminal thereof is formed. For the insulating material, a synthetic resin containing an insulating filler is used. The via portion is formed by laser irradiation or the like over the insulating material.

For example, Japanese Patent Application Laid-open No. 2011-029623 discloses a substrate with built-in component in which a resin layer with built-in component is constituted of a side surface layer formed of a part lower than an upper surface of a chip component and an upper surface layer formed of a part higher than the upper surface of the chip component and having a via conductor formed therein. For the purpose of facilitation of forming a hole of the via conductor by laser irradiation and other purposes, in the substrate with built-in component, a content of an inorganic material such as an insulating filler contained in the upper surface layer is set to be less than a content of the inorganic material such as the insulating filler contained in the side surface layer.

SUMMARY

However, in the structure disclosed in Japanese Patent Application Laid-open No. 2011-029623, a terminal electrode and an upper surface of a component body weaker than the terminal electrode are in contact with the upper surface layer. Further, the upper surface layer has the smaller inorganic material content than the side surface layer, and thus causes thermal expansion or thermal contraction more markedly than the side surface layer. Therefore, a stress associated with the thermal expansion or the thermal contraction generated on the upper surface layer is directly transmitted to the weak component body, causing damage such as a crack. The damage may cause a failure of functions of the component.

In view of the above-mentioned circumstances, it is desirable to provide a substrate with built-in electronic component which is capable of preventing failures of the electronic component.

According to an embodiment of the present disclosure, there is provided a substrate with built-in electronic component including a component storage layer and two buildup layers.

The component storage layer includes an electronic component and a cover portion having an insulating property. The electronic component includes a terminal surface and a main body. The cover portion includes a first surface formed to be flush with the terminal surface, covers the main body of the electronic component, and has a first linear expansion coefficient.

The two buildup layers each include an insulating layer and a via portion. The insulating layer is formed to be adjacent to the cover portion and has a second linear expansion coefficient larger than the first linear expansion coefficient. The via portion is provided in the insulating layer and is connected to the terminal surface. The two buildup layers are provided with the component storage layer sandwiched therebetween.

The insulating layer of one of the two buildup layers is formed to be in contact with the terminal surface and the first surface.

According to another embodiment of the present disclosure, there is provided a substrate with built-in electronic component including a component storage layer and two buildup layers.

The component storage layer includes an electronic component and a cover portion having an insulating property. The electronic component includes a terminal surface and a main body. The cover portion includes a first surface which is flush with the terminal surface, covers the main body of the electronic component, and is made of a first resin material containing an insulating filler at a first content.

The two buildup layers each include an insulating layer and a via portion. The insulating layer is formed to be adjacent to the cover portion and is made of a second resin material containing an insulating filler at a second content smaller than the first content. The via portion is provided in the insulating layer and is connected to the terminal surface. The two buildup layers are provided with the component storage layer sandwiched therebetween.

The insulating layer of one of the two buildup layers is formed to be in contact with the terminal surface and the first surface.

Further, according to the present disclosure, the substrate with built-in electronic component includes a core layer having at least one cavity, an electronic component stored in the cavity, an insulating portion that fills a gap between the cavity and the electronic component, an insulating layer provided on one surface of the core layer in a thickness direction, and a via portion provided in the insulating layer and connected to a connection surface of a terminal of the electronic component. In the substrate with built-in electronic component, a linear expansion coefficient of the insulating portion and a linear expansion coefficient of the insulating layer has such a relationship that the linear expansion coefficient of the insulating portion<the linear expansion coefficient of the insulating layer is satisfied. An interface between the insulating portion and the insulating layer and the connection surface of the terminal are flush with the one surface of the core layer in the thickness direction, and parts other than the connection surface of the terminal in the electronic component are not in contact with the insulating layer.

According to the present disclosure, it is possible to provide the substrate with built-in electronic component which is capable of preventing the failures of the electronic component.

These and other objects, features and advantages of the present disclosure will become more apparent in light of the following detailed description of best mode embodiments thereof, as illustrated in the accompanying drawings.

DETAILED DESCRIPTION OF THE EMBODIMENTS

According to an embodiment of the present disclosure, there is provided a substrate with built-in electronic component including a component storage layer and two buildup layers.

The component storage layer includes an electronic component and a cover portion having an insulating property. The electronic component includes a terminal surface and a main body. The cover portion includes a first surface formed to be flush with the terminal surface, covers the main body of the electronic component, and has a first linear expansion coefficient.

The two buildup layers each include an insulating layer and a via portion. The insulating layer is formed to be adjacent to the cover portion and has a second linear expansion coefficient larger than the first linear expansion coefficient. The via portion is provided in the insulating layer and is connected to the terminal surface. The two buildup layers are provided with the component storage layer sandwiched therebetween.

The insulating layer of one of the two buildup layers is formed to be in contact with the terminal surface and the first surface.

With this structure, the first surface of the cover portion and the terminal surface of the electronic component are flush with each other, and the parts other than the terminal surface of the electronic component are not in contact with the insulating layer. Therefore, even in the case where a thermal expansion or a thermal contraction occurs in the insulating layer, it is possible to suppress a stress associated therewith from being transmitted to the main body of the electronic component. As a result, it is possible to prevent the weak main body of the electronic component from being damaged and prevent a failure of the electronic component.

The component storage layer may further include a core material in which a cavity for storing the electronic component and the cover portion is formed. The core material includes a second surface which is flush with the terminal surface and the first surface.

By the core material, it is possible to increase rigidity of the entire substrate with built-in electronic component. Further, the core material is formed of a conductor, thereby making it possible to suppress an electromagnetic failure in the electronic component stored in the cavity.

The electronic component may include a plurality of electronic components stored in the cavity.

With this structure, it is possible to reduce the number of parts mounted on the substrate with built-in electronic component, with the result that the entire substrate can be downsized.

The main body of the electronic component may include a depressed portion which is depressed from the terminal surface and covered with the cover portion.

With this structure, it is possible to prevent the main body of the electronic component and the insulating layer from being in contact with each other. Further, it is also possible to increase a contact area of the cover portion and the insulating layer, which can prevent peeling or the like on an interface therebetween.

Further, the cover portion may be made of a first resin material containing an insulating filler at a first content, and the insulating layer may be made of a second resin material containing an insulating filler at a second content smaller than the first content.

With this structure, it is possible to determine the linear expansion coefficients of the cover portion and the insulating layer on the basis of the contents of the insulating fillers, and the linear expansion coefficients can be easily adjusted.

In this case, the insulating fillers of the first resin material and the second resin material may each have a spherical shape.

With this structure, it is possible to increase fluidity and dispersiveness of the insulating fillers at a time of forming the cover portion and the insulating layer, and thus it is possible to form the cover portion and the insulating layer having uniform characteristics.

According to another embodiment of the present disclosure, there is provided a substrate with built-in electronic component including a component storage layer and two buildup layers.

The component storage layer includes an electronic component and a cover portion having an insulating property. The electronic component includes a terminal surface and a main body. The cover portion includes a first surface formed to be flush with the terminal surface, covers the main body of the electronic component, and is made of a first resin material containing an insulating filler at a first content.

The two buildup layers each include an insulating layer and a via portion. The insulating layer is formed to be adjacent to the cover portion and is made of a second resin material containing an insulating filler at a second content smaller than the first content. The via portion is provided in the insulating layer and is connected to the terminal surface. The two buildup layers are provided with the component storage layer sandwiched therebetween.

The insulating layer of one of the two buildup layers is formed to be in contact with the terminal surface and the first surface.

With this structure, the first surface of the cover portion and the terminal surface of the electronic component are flush with each other, and the parts other than the terminal surface of the electronic component are not in contact with the insulating layer. Further, the linear expansion coefficient of the cover portion can be set to be smaller than the linear expansion coefficient of the insulating layer. As a result, even in the case where the thermal expansion or the thermal contraction occurs in the insulating layer, it is possible to suppress the stress associated therewith from being transmitted to the main body of the electronic component. Therefore, it is possible to prevent the weak main body of the electronic component from being damaged and prevent a failure of the electronic component.

Hereinafter, embodiments of the present disclosure will be described with reference to the drawings.
(First Embodiment (FIGS. 1 and 2))

Figure 1:
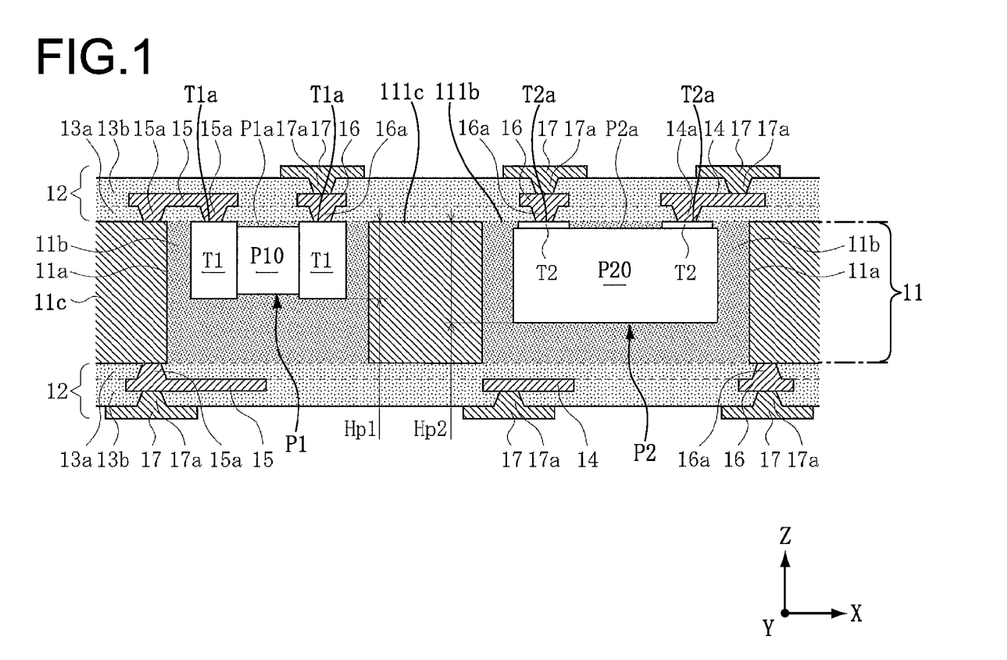
FIG. 1 is a vertical cross-sectional view of a main part of a substrate with built-in electronic component (first embodiment) to which the present disclosure is applied.

FIG. 1 is a vertical cross-sectional view of a substrate with built-in electronic component according to this embodiment. In each of FIGS. 1 to 3, an X-axis direction, a Y-axis direction, and a Z-axis direction indicate three axis directions orthogonal to one another. The X-axis direction and the Y-axis direction indicate horizontal directions, and the Z-axis direction indicates a thickness direction (vertical direction).

First, a basic structure of the substrate with built-in electronic component shown in FIG. 1 will be described. The substrate with built-in electronic component is provided with a component storage layer 11 and a buildup layer 12 formed on one surface (upper surface) of the component storage layer 11, which is perpendicular to the Z-axis direction (thickness direction), and on the other surface (lower layer) of the component storage layer 11, which is perpendicular to the Z-axis direction (thickness direction).

The component storage layer 11 includes two electronic components P1 and P2 and an insulating cover portion 11b, and a core material 11c. As a whole, the component storage layer 11 has the structure in which the electronic components P1 and P2 and the cover portion 11b are stored in a cavity 11a formed in the core material 11c.

The core material 11c includes a second surface 111c that faces a first insulating layer 13a (described below) of the buildup layer 12. In the core material 11c, the two cavities 11a that penetrate the core material are formed. The second surface 111c is formed on an upper surface (one surface in the thickness direction) of the core material 11c, which is perpendicular to the Z-axis direction, so as to be flush with terminal surfaces T1a and T2a (described below) and a first surface 111b of the cover portion 11b. The core material 11c is formed of a conducting body, such as metal, having approximately the same thickness as the component storage layer 11 and is preferably made of copper, a copper alloy, or the like. In this embodiment, one electronic component P1 and one electronic component P2 are separately stored in the cavities 11a, respectively.

With the core material 11c, it is possible to increase the rigidity of an entire substrate with built-in electronic component. Further, the core material is formed of the conducting body, thereby making it possible to suppress electromagnetic failures in the electronic component P1 and the electronic component P2 stored in the cavities 11a.

The cover portion 11b includes the first surface 111b which is flush with the terminal surface T1a and the terminal surface T2a and covers a main body P10 of the electronic component P1 and a main body P20 of the electronic component P2. The cover portion 11b is formed so as to fill a gap between the electronic components P1 and P2 and the core material 11c in the cavities 11a. The cover portion 11b is made of a first resin material containing an insulating filler. As the first resin material, a synthetic resin of an epoxy resin, polyimide, a bismaleimide triazine resin, or the like (not only a thermosetting resin but also a thermoplastic resin can be used) is desirably used. As the insulating filler, silica, alumina, or the like is desirably used. The shape of the insulating filler may be a spherical shape, a flake shape, or a fiber shape, but the spherical shape is desirable in consideration of fluidity or dispersiveness of the insulating filler at a time of producing the cover portion 11b.

The electronic components P1 and P2 are selected from known electronic components such as a capacitor, an inductor, a register, a filter chip, and an IC chip. Further, a thickness Hp1 of the electronic component P1 is less than a thickness Hp2 of the electronic component P2.

As shown in FIG. 1, the electronic component P1 includes the main body P10 having an approximately rectangular parallelepiped shape and the two terminal surfaces T1a. The electronic component P1 has cap-shaped terminals Ti on end portions of the main body P10 which are opposed in the X-axis direction. Surfaces (upper surfaces) that face the first insulating layer 13a (described below) of the terminals T1 are formed as the terminal surfaces T1a. The terminal surfaces T1a serve as connection surfaces for connecting via portions 15a and 16a (described below).

Further, the main body P10 includes a depressed portion P1a that is depressed downward in the Z-axis direction from the terminal surfaces T1a. The depressed portion P1a is formed according to a protruded height of the terminals Ti on a side facing the first insulating layer 13a (described below) of the electronic component P1. That is, the depressed portion P1a is provided between the terminals T1 opposed to each other and is covered with the cover portion 11b.

On the other hand, like the electronic component P1, the electronic component P2 includes the terminal surfaces T2a. That is, the electronic component P2 has two or three or more plate-shaped terminals T2 on one surface (upper surface) of the main body P20 which is perpendicular to the Z-axis direction. Surfaces (upper surfaces) facing the first insulating layer 13a (described below) of the terminals T2 are formed as the terminal surfaces T2a. The terminal surfaces T2a serve as connection surfaces for connecting a via portion 14a the via portions 16a (described below).

In addition, the main body P20 includes a depressed portion P2a that is depressed downward in the Z-axis direction from the terminal surface T2a. The depressed portion P2a is formed according to a protruded height of the terminals T2 on a side facing the first insulating layer 13a (described below) of the electronic component P2. That is, the depressed portion P2a is provided between the terminals T2 opposed to each other and around the terminals T2 and is covered with the cover portion 11b.

With this structure, the first surface 111b of the cover portion 11b, the second surface 111c of the core material 11c, and the terminal surfaces T1a and T2a are formed so as to be flush with each other. That is, the electronic components P1 and P2 can have the structure in which parts other than the terminal surfaces T1a and T2a are not in contact with the buildup layer 12.

The buildup layers 12 includes the first insulating layer (insulating layer) 13a, a second insulating layer 13b, signal wirings 14, ground wirings 15, conductor vias 16, conductor pads 17, the via portions 14a, 15a, and 16a, and via portions 17a.

The first insulating layer 13a is formed on the component storage layer 11 in contact with the terminal surfaces T1a and T2a and the first surface 11b. The second insulating layer 13b is formed on the first insulating layer 13a. The first insulating layer 13a and the second insulating layer 13b are made of a second resin material containing an insulating filler. As the second resin material, the synthetic resin of the epoxy resin, polyimide, the bismaleimide triazine resin, or the like (not only a thermosetting resin but also a thermoplastic resin can be used) is desirably used. As the insulating filler, silica, alumina, or the like is desirably used. The shape of the insulating filler is not particularly limited as in the case of the first resin material, but the spherical shape is desirable in consideration of fluidity or dispersiveness of the insulating filler at a time of production.

The signal wirings 14, the ground wirings 15, the conductor vias 16 are two-dimensionally patterned between the first insulating layer 13a and the second insulating layer 13b. The conductor pads 17 are two-dimensionally patterned on the surface of the second insulating layer 13b. In addition, the signal wirings 14, the ground wirings 15, the conductor vias 16, and the conductor pads 17 integrally include the via portions 14a, 15a, 16a, and 17a each having an approximately truncated cone, respectively. The signal wirings 14, the ground wirings 15, the conductor vias 16, and the conductor pads 17 are made of metal, desirably, copper, a copper alloy, or the like.

The via portions 14a, 15a, and 16a are formed in the first insulating layer 13a and connected to the corresponding terminal surfaces T1a and T2a. On the other hand, the via portion 17a is formed in the second insulating layer 13b to provide an interlayer connection between the conductor pad 17 and the conductor via 16. In the example shown in FIG. 1, the via portion 14a of the signal wiring 14 in the buildup layer 12 provided on one surface (upper surface) of the component storage layer 11, which is perpendicular to the Z-axis direction, is connected to the terminal surface T2a of the electronic component P2. The via portion 16a of the conductor via 16 on one side (right side in the figure) is connected to the other terminal surface T2a of the electronic component P2. Further, the via portion 15a of the ground wiring 15 on one side (right side) is connected to the terminal surface T1a of the electronic component P1. The via portion 16a of the conductor via 16 on the other side (left side) is connected to the other terminal surface T1a of the electronic component P1. The via portion 15a of the ground wiring on the other side (left side) is connected to the second surface 111c of the core material 11c. The via portions 17a of three conductor pads 17 are connected to the signal wiring 14 and the two conductor vias 16, respectively. On the other hand, the via portion 15a of the ground wiring 15 and the via portion 16a of the conductor via 16 in the buildup layer 12 provided on the other surface (lower surface) of the component storage layer 11, which is perpendicular to the Z-axis direction, are connected to the other surface (lower surface of the second surface 111c on the opposite side) of the core material 11c, which is perpendicular to the Z-axis direction. In addition, the via portions of the three conductor pads 17 are connected to the signal wiring 14, the ground wiring 15, and the conductor via 16, respectively.

Further, the first insulating layer 13a and the second insulating layer 13b are made of the second resin material containing the insulating filler. As the second resin material, the synthetic resin of the epoxy resin, polyimide, the bismaleimide triazine resin, or the like (not only a thermosetting resin but also a thermoplastic resin can be used) is desirably used. As the insulating filler, silica, alumina, or the like is desirably used. The shape of the insulating filler may be a spherical shape, a flake shape, or a fiber shape, but the spherical shape is desirable in consideration of fluidity or dispersiveness of the insulating filler at a time of producing the first insulating layer 13a and the second insulating layer 13b.

An example of the thicknesses of the core material 11c, the first insulating layer 13a, the second insulating layer 13b, the signal wiring 14, the ground wiring 15, a flange portion of the conductor via 16, and the conductor pad 17 will be given. In the case where the thickness of the core material 11c falls within the range of 100 to 400 µm, the thicknesses of the first insulating layer 13a and the second insulating layer 13b fall within the range of 10 to 30 µm, and the thicknesses of the signal wiring 14, the ground wiring 15, the flange portion of the conductor via 16, and the conductor pad 17 fall within the range of 5 to 25 µm. The depths of the depressed portions P1a and P2a of the electronic components P1 and P2 fall within the range of 5 to 15 µm.

Subsequently, linear expansion coefficients of the cover portion 11b, the first insulating layer 13a, and the second insulating layer 13b will be described.

The cover portion 11b has a first linear expansion coefficient, and the first insulating layer 13a and the second insulating layer 13b have a second linear expansion coefficient larger than the first linear expansion coefficient. That is, a relationship of "the linear expansion coefficient of the cover portion 11b (first linear expansion coefficient)<the linear expansion coefficient of the first insulating layer 13a and the second insulating layer 13b (second linear expansion coefficient)" is satisfied. Specifically, the first linear expansion coefficient desirably falls within the range of 15 to 25 ppm/° C., and the second linear expansion coefficient desirably falls within the range of 35 to 50 ppm/° C. The first linear expansion coefficient and the second linear expansion coefficient are selected from the ranges so as to satisfy the relationship mentioned above.

Further, the first linear expansion coefficient and the second linear expansion coefficient are determined by insulating filler contents of the first resin material and the second resin material. Specifically, the first resin material of the cover portion 11b contains the insulating filler at a first content, and the second resin material of the first insulating layer 13a and the second insulating layer 13b contains the insulating filler at a second content smaller than the first content. That is, a relationship of "the insulating filler content of the cover portion 11b (first content)>the insulating filler content of the first insulating layer 13a and the second insulating layer 13b (second content)" is satisfied. More specifically, the first content desirably falls within the range of 65 to 75 wt %, and the second content desirably falls within the range of 30 to 45 wt %. The first content and the second content are selected from the ranges so as to satisfy the relationship mentioned above.

If the ranges of the linear expansion coefficients and the ranges of the insulating filler contents are satisfied, it is possible to ensure desired heat resistances and bending strengths of the first insulating layer 13a and the second insulating layer 13b. Further, it is possible to set the degree of the thermal expansion or thermal contraction of the cover portion 11b to be closer to the degree of the thermal expansion or thermal contraction of the electronic components P1 and P2 and the core material 11c.

Further, in the case where the insulating filler has the spherical shape, an average particle diameter of the insulating fillers desirably falls within the range of 0.5 to 1.0 µm, more desirably, 0.5 µm or less. Within the range, if the first insulating layer 13a and the second insulating layer 13b have the thicknesses (10 to 30 µm) as exemplified above, and the depressed portions P1a and P2a of the electronic components P1 and P2 have the depths (5 to 15 µm) as exemplified above, desirable fluidity and dispersiveness of the insulating fillers in the first insulating layer 13a and the second insulating layer 13b can be obtained, and the desirable fluidity and dispersiveness of the insulating fillers in the cover portion 11b which are filled in the depressed portions P1a and P2a can be obtained.

Subsequently, with reference to FIGS. 2A to 2C, a component storage layer forming process (component burying process) according to the substrate with built-in electronic component shown in FIG. 1 will be described.

Figure 2A:
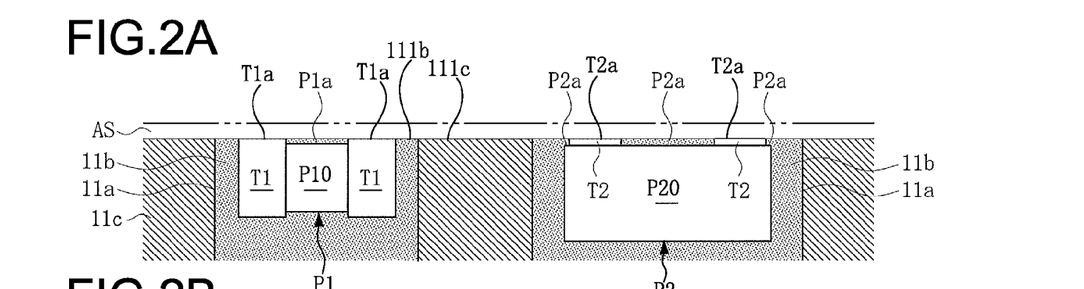
FIGS. 2A-2C are diagrams showing a component burying process and a via portion manufacturing process according to the substrate with built-in electronic component shown in FIG. 1.

As shown in FIG. 2A, in the cavities 11a of the core material 11c, the electronic components P1 and P2 are separately buried, thereby forming the component storage layer 11. First, to the second surface 111c of the core material 11c, an adhesive sheet AS is bonded. Then, from an opposite side (lower side) of the second surface 111c of the core material 11c, the electronic components P1 and P2 are inserted into the cavities 11a with the terminal surfaces T1a and T2a directed upward, and the terminal surfaces T1a and T2a are bonded to the adhesive sheet AS. Then, from the opposite side (lower side) of the second surface 111c of the core material 11c, an uncured material to be the cover portion 11b is filled in the cavities 11a and cured. After the material is cured, the adhesive sheet AS is peeled off. In the depressed portion P1a of the electronic component P1 and the depressed portion P2a of the electronic component P2, a part of the uncured material is filled without a gap at a time of filling the uncured material to be the cover portion 11b. As a result, the terminal surfaces T1a and T2a of the electronic components P1 and P2 are flush with the second surface 111c of the core material 11c. It should be noted that, in fact, the process is carried out with the component storage layer 11 turned upside down.

Subsequently, the via portions 14a, 15a, and 16a are formed. First, as shown in FIG. 2B, on the second surface 111c of the core material 11c, an uncured material layer to be the first insulating layer 13a is formed and then cured, thereby forming the first insulating layer 13a. As a result, an interface between the cover portion 11b and the first insulating layer 13a is flush with the second surface 111c of the core material 11c. Then, parts on the first insulating layer 13a where the via portions are formed are irradiated with laser light, thereby forming holes TH which have an approximately truncated cone shape and reach the terminal surfaces T1a and T2a of the electronic components P1 and P2.

Figure 2B:
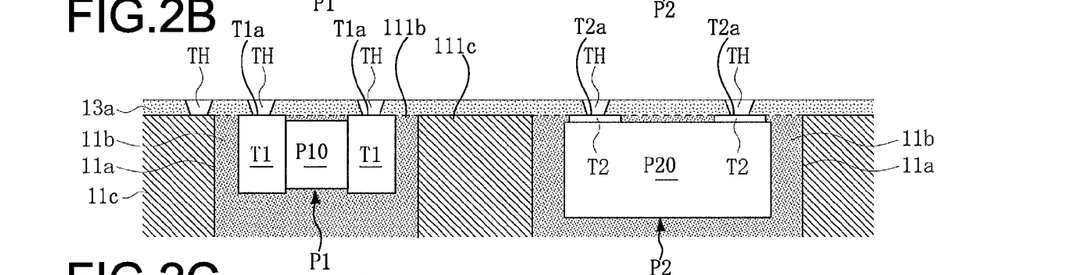
Figure 2C:
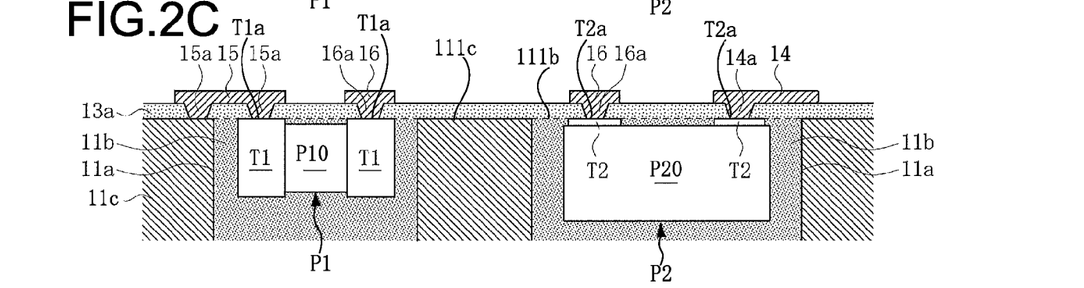

Subsequently, after patterning of a plating resist (not shown) is performed on the surface of the first insulating layer 13a, as shown in FIG. 2C, by electrolytic plating, the signal wiring 14, the ground wiring 15, and the conductor via 16 (via portions 14a, 15a, and 16a formed so as to fill the holes TH) are formed. As a result, the signal wiring 14, the ground wiring 15, and the conductor via 16 connected to the terminal surfaces T1a and T2a of the electronic components P1 and P2 are formed.

Next, the effect obtained by the substrate with built-in electronic component shown in FIG. 1 will be described.

(E11) In the substrate with built-in electronic component shown in FIG. 1, the second linear expansion coefficient of the first insulating layer 13a of the buildup layer 12 is larger than the first linear expansion coefficient of the cover portion 11b. That is, the insulating filler content (second content) of the first insulating layer 13a is smaller than the insulating filler content (first content) of the cover portion 11b. As a result, when the holes TH of the via portions are formed in the first insulating layer 13a, it is unnecessary to increase the intensity of laser light, and it is possible to reduce a possibility of damaging the terminal surfaces T1a and T2a exposed on bottoms of the holes TH. Further, it is possible to reduce the amount of the insulating fillers remaining at the bottoms of the holes TH formed by the laser processing and thus suppress a connection failure on the terminal surfaces T1a and T2a.

On the other hand, in the past, in the case where the thermal expansion or the thermal contraction occurs in the first insulating layer 13a, a stress associated therewith is transmitted to the main bodies P10 and P20 weaker than the terminals T1 and T2, which may result in a failure of the electronic components P1 and P2.

In view of this, in the present disclosure, the first surface 111b of the cover portion 11b, the terminal surfaces T1a and T2a, and the second surface 111c of the core material 11c are flush with each other and are in contact with the first insulating layer 13a. With this structure, it is possible to provide the structure in which parts other than the terminal surfaces T1a and T2a of the electronic components P1 and P2 are not in contact with the first insulating layer 13a. Thus, even if the thermal expansion or the thermal contraction occur in the first insulating layer 13a, it is possible to suppress the stress associated with the thermal expansion or the thermal contraction from being transmitted to the parts other than the terminal surfaces T1a and T2a of the electronic components P1 and P2. Therefore, it is possible to prevent an occurrence of a damage such as a crack in the main bodies P10 and P20 and suppress a failure of the electronic components P1 and P2. Furthermore, the degree of the thermal expansion or the thermal contraction generated in the cover portion 11b can be close to the degree of the thermal expansion or the thermal contraction of the electronic components P1 and P2 and the core material 11c, so it is possible to suppress a sealing capability from deteriorating due to an occurrence of a crack in the cover portion 11b.

(E12) In the substrate with built-in electronic component shown in FIG. 1, the electronic component P1 has the depressed portion P1a, which is depressed from the terminal surface T1a, and the electronic component P2 has the depressed portion P2a, which is depressed from the terminal surface T2a. In the depressed portions P1a and P2a, a part of the cover portion 11b is filled.

That is, the cover portion 11b intervenes between the depressed portions P1a and P2a and the first insulating layer 13a, thereby making it possible to positively prevent the main bodies P10 and P20 and the first insulating layer 13a from being brought into contact with each other. Therefore, it is possible to secure the effect of E11 described above. In addition, the contact area of the cover portion 11b and the first insulating layer 13a can be increased, so it is possible to suppress interlayer peeling between the cover portion 11b and the first insulating layer 13a in cavities 11a from being caused.

(E13) In the substrate with built-in electronic component shown in FIG. 1, the insulating filler content (second content) of the first insulating layer 13a is smaller than the insulating filler content (first content) of the cover portion 11b. As a result, the second linear expansion coefficient of the first insulating layer 13a is set to be larger than the first linear expansion coefficient of the cover portion 11b.

That is, regardless of whether the kind of the synthetic resin as the main body of the cover portion 11b is the same as or different from that of the first insulating layer 13a, the relationship between the linear expansion coefficients of the cover portion 11b and the first insulating layer 13a can be easily determined by the insulating filler contents thereof.

(E14) In the process of forming the component storage layer of the substrate with built-in electronic component shown in FIG. 2, the terminal surfaces T1a and T2a of the electronic components P1 and P2 are individually bonded to the adhesive sheet AS bonded to the second surface 111c of the core material 11c, and then an uncured material is filled on the adhesive sheet AS, thereby forming the cover portion 11b. As a result, even in the case where the thickness Hp1 of the electronic component P1 is different from the thickness Hp2 of the electronic component P2, the first surface 111b of the cover portion 11b, the second surface 111c of the core material 11c, and the terminal surfaces T1a and T2a are easily formed so as to be flush with each other.

(E15) In the substrate with built-in electronic component shown in FIG. 1, the cover portion 11b having a high insulating filler content is not provided on the terminal surfaces T1a and T2a of the electronic components P1 and P2. Therefore, in the process of forming the via portions shown in FIG. 2B, at a time when the parts where the via portions are to be formed are irradiated with the laser light over the first insulating layer 13a to form the holes TH, it is possible to suppress the insulating filler contained in the first insulating layer 13a from remaining on the bottoms of the holes TH, that is, on the terminal surfaces T1a and T2a. Thus, even when the signal wiring 14, the ground wiring 15, and the conductor via 16 (including the via portions 14a, 15a, and 16a formed so as to fill the holes TH) are formed by the electrolyte plating in a subsequent process, it is possible to desirably connect the via portions 14a, 15a, and 16a with the terminal surfaces T1a and T2a. Further, the holes TH can be formed without increasing the intensity of the laser light, so it is possible to suppress the terminal surfaces T1a and T2a exposed on the bottoms of the holes TH from being damaged.

(Second Embodiment (FIG. 3))

Figure 3:
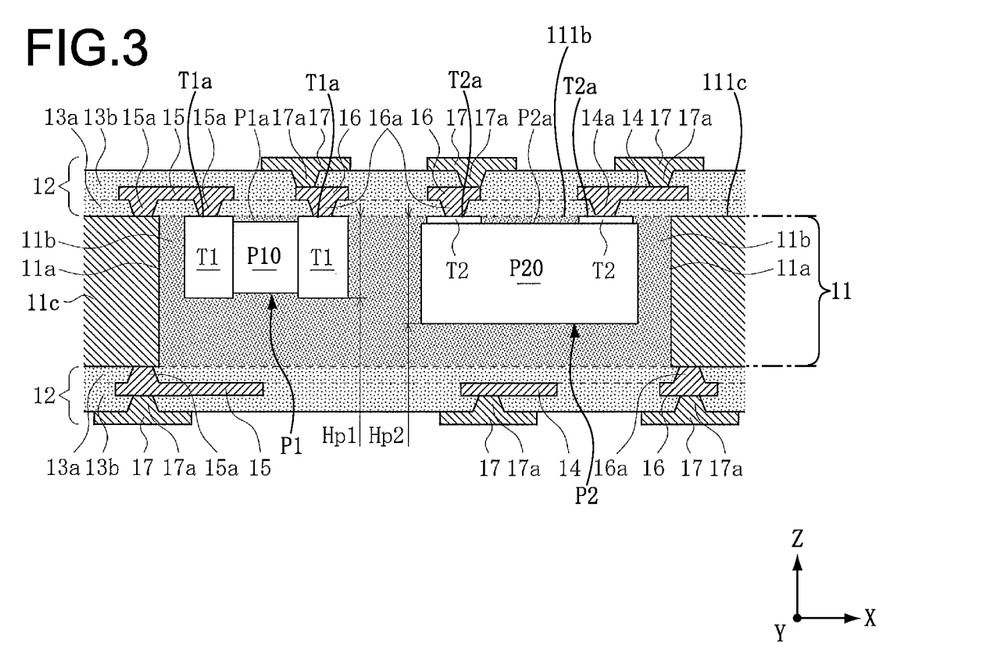
FIG. 3 is a vertical cross-sectional view of a main part of a substrate with built-in electronic component (second embodiment) to which the present disclosure is applied.

A substrate with built-in electronic component shown in FIG. 3 is different from the substrate with built-in electronic component shown in FIG. 1 in that the component storage layer 11 includes a plurality of electronic components stored in one cavity 11a. Further, as in the first embodiment, the cover portion 11b is stored in the cavity 11a with the electronic components P1 and P2 and is provided so as to fill the gap between the electronic components P1 and P2 and the cavity 11a. It should be noted that the component storage layer forming process (component burying process) according to the substrate with built-in electronic component is the same as the process described above except that the two electronic components P1 and P2 are inserted in the one cavity 11a, and then an uncured material to be the cover portion 11b is filled.

As in the case of the substrate with built-in electronic component shown in FIG. 1, with the substrate with built-in electronic component shown in FIG. 3, the following effects are also obtained.

(E21) In the substrate with built-in electronic component shown in FIG. 3, the second linear expansion coefficient of the first insulating filler 13a of the buildup layer 12 is larger than the first linear expansion coefficient of the cover portion 11b. That is, the insulating filler content (second content) of the first insulating layer 13a is smaller than the insulating filler content (first content) of the cover portion 11b. Further, the first surface 111b of the cover portion 11b, the terminal surfaces T1a and T2a, and the second surface 111c of the core material 11c are flush with each other and are in contact with the first insulating layer 13a.

That is, in this embodiment, it is also possible to provide the structure in which the parts other than the terminal surfaces T1a and T2a of the electronic components P1 and P2 are not in contact with the first insulating layer 13a. Therefore, even if the thermal expansion or the thermal contraction occurs in the first insulating layer 13a, it is possible to suppress the stress associated with the thermal expansion or the thermal contraction is transmitted to the parts other than the terminal surfaces T1a and T2a of the electronic components P1 and P2. As a result, it is possible to prevent an occurrence of damage such as a crack in the main bodies P10 and P20, and therefore it is possible to suppress a failure of the electronic components P1 and P2 from being caused. In addition, the degree of the thermal expansion or the thermal contraction generated in the cover portion 11b can be close to the degree of the thermal expansion or the thermal contraction of the electronic components P1 and P2 and the core material 11c, so it is possible to suppress a sealing capability from deteriorating due to an occurrence of a crack in the cover portion 11b.

(E22) In the substrate with built-in electronic component shown in FIG. 3, the electronic component P1 has the depressed portion P1a depressed from the terminal surface T1a, and the electronic component P2 has the depressed portion P2a depressed from the terminal surface T2a. In the depressed portions P1a and P2a, a part of the cover portion 11b is filled.

That is, the cover portion 11b intervenes between the depressed portions P1a and P2a and the first insulating layer 13a, thereby making it possible to positively prevent the main bodies P10 and P20 and the first insulating layer 13a from being brought into contact with each other. Therefore, it is possible to secure the effect of E21 described above. In addition, the contact area of the cover portion 11b and the first insulating layer 13a can be increased by filling the part of the cover portion 11b in the depressed portions P1a and P2a, so it is possible to suppress interlayer peeling between the cover portion 11b and the first insulating layer 13a in cavity 11a from being caused.

(E23) In the substrate with built-in electronic component shown in FIG. 3, the insulating filler content (second content) of the first insulating layer 13a is smaller than the insulating filler content (first content) of the cover portion 11b. As a result, the second linear expansion coefficient of the first insulating layer 13a is set to be larger than the first linear expansion coefficient of the cover portion 11b.

That is, regardless of whether the kind of the synthetic resin as the main body of the cover portion 11b is the same as or different from that of the first insulating layer 13a, the relationship between the linear expansion coefficients of the cover portion 11b and the first insulating layer 13a can be easily determined by the insulating filler contents thereof.

(E24) In the process of forming the component storage layer of the substrate with built-in electronic component shown in FIG. 3, with reference to FIG. 2, the terminal surfaces T1a and T2a of the electronic components P1 and P2 are individually bonded to the adhesive sheet AS bonded to the second surface 111c of the core material 11c, and then an uncured material is filled on the adhesive sheet AS, thereby forming the cover portion 11b. As a result, even in the case where the thickness Hp1 of the electronic component P1 is different from the thickness Hp2 of the electronic component P2, the first surface 111b of the cover portion 11b, the second surface 111c of the core material 11c, and the terminal surfaces T1a and T2a are easily formed so as to be flush with each other.

(E25) In the substrate with built-in electronic component shown in FIG. 3, the cover portion 11b having a high insulating filler content is not provided on the terminal surfaces T1a and T2a of the electronic components P1 and P2. Therefore, in the process of forming the via portions, at a time when the parts where the via portions are to be formed are irradiated with the laser light over the first insulating layer 13a to form the holes TH, it is possible to suppress the insulating fillers contained in the first insulating layer 13a from remaining on the bottoms of the holes TH, that is, on the terminal surfaces T1a and T2a. Thus, even when the signal wiring 14, the ground wiring 15, and the conductor via 16 (including the via portions 14a, 15a, and 16a formed so as to fill the holes TH) are formed by the electrolyte plating in a subsequent process, it is possible to desirably connect the via portions 14a, 15a, and 16a with the terminal surfaces T1a and T2a. Further, the holes TH can be formed without increasing the intensity of the laser light, so it is possible to suppress the terminal surfaces T1a and T2a exposed on the bottoms of the holes TH from being damaged.

(Other embodiments (No Figure))

(1) In FIGS. 1 and 3, the core material 11c made of metal is shown, but the core material 11c may be a conductor made of a material other than the metal. Further, in the case where the core material 11c is made of a non-metallic material such as ceramics or a synthetic resin, the same effect can be exerted. In addition, the structure without the core material 11c can also be adopted. In this case, the same effect can also be exerted.

(2) In FIGS. 1 and 3, the electronic component P1 having the cap-shaped terminals T1 and the electronic component P2 having the plate-shaped terminals T2 are shown, but the shapes of the terminals Ti and T2 are not particularly limited.

In the case where the electronic components with terminals having other shapes are buried in the cavities 11a, the same effect can be exerted.

(3) In FIGS. 1 and 3, the electronic components P1 and P2 having different thicknesses are shown. However, in the case where the electronic components P1 and P2 have the same thickness, the same effect can be exerted.

(4) In FIG. 3, the substrate with built-in electronic component in which the two electronic components P1 and P2 are buried in the one cavity is shown. However, in the case where three or more electronic components are buried in one cavity, the same effect can be exerted.

(5) In FIGS. 1 and 3, the substrate with built-in electronic component in which the buildup layers 12 are provided on each of the upper surface and the lower surface of the component storage layer 11 is shown. However, in the case where the buildup layer 12 is provided only on the upper surface of the component storage layer 11, the same effect can be exerted. Further, even in the case where the wiring form of the buildup layer 12 provided on the upper surface of the component storage layer 11 is different from the wiring form shown in FIGS. 1 and 3, if an insulating layer corresponding to the first insulating layer 13a is provided, the same effect can be exerted.

(6) The cover portion 11b, the first insulating layer 13a, and the second insulating layer 13b shown in FIGS. 1 and 3 are formed of the resin material containing the insulating filler, but the material is not limited to this. As long as the linear expansion coefficients of the first insulating layer 13a and the second insulating layer 13b are larger than the linear expansion coefficient of the cover portion 11b, any insulating materials can be used therefore.

What is claimed is:

1. A substrate with built-in electronic component, comprising:
    a component storage layer including an electronic component and a cover portion having an insulating property and a core material in which a cavity for storing the electronic component and the cover portion is formed, the electronic component including a terminal surface and a main body, the cover portion including a first surface formed to be flush with the terminal surface, covering the main body of the electronic component, and having a first linear expansion coefficient; and
    a first buildup layer and a second buildup layer each including an insulating layer and a via portion, the insulating layer being formed to come into close contact with the cover portion and having a second linear expansion coefficient larger than the first linear expansion coefficient, the via portion being provided in the insulating layer and being connected to the terminal surface, the first buildup layer and the second buildup layer being provided with the component storage layer sandwiched there between, wherein
    the insulating layer of the first buildup layer is formed to come into close contact with the terminal surface and the first surface,
    the core material includes a second surface which is flush with the terminal surface and the first surface and is entirely made of metal, the second surface entirely comes into close contact with the insulating layer of the first buildup layer, and
    the main body of the electronic component includes a third surface which faces the insulating layer of the first buildup layer, the third surface being covered by the cover portion,
    the insulating layer of the first buildup layer includes a first insulating layer being formed on the component storage layer to come into close contact with the terminal surface and the first surface and a second insulating layer being formed on the first insulating layer,
    the first buildup layer includes a ground wiring being formed between the first insulating layer and the second insulating layer,
    the via portion of the first buildup layer is provided in the first insulating layer and includes a first via portion being directly connected to the terminal surface and the ground wiring and a second via portion being directly connected to the ground wiring being connected to the first via portion and the second surface,
    the ground wiring is maintained at ground potential, and
    the entirety of the core material, the second via portion, the first via portion and the terminal surface being connected to the first via portion are also maintained at ground potential by being electrically connected to the ground wiring.

2. The substrate with built-in electronic component according to claim 1, wherein
    the core material is made of copper or a copper alloy.

3. The substrate with built-in electronic component according to claim 2, wherein
    the electronic component includes a plurality of electronic components stored in the cavity.

4. The substrate with built-in electronic component according to claim 1, wherein
    the main body of the electronic component includes a depressed portion which is depressed from the terminal surface and covered with the cover portion, and
    the third surface is formed in the depressed portion.

5. The substrate with built-in electronic component according to claim 1, wherein
    the cover portion is made of a first resin material containing an insulating filler at a first content, and
    the insulating layer is made of a second resin material containing an insulating filler at a second content smaller than the first content.

6. The substrate with built-in electronic component according to claim 5, wherein
    the insulating fillers of the first resin material and the second resin material each have a spherical shape.

7. The substrate with built-in electronic component according to claim 1, wherein
    the first via portion and the second via portion are arranged to be opposed across a peripheral surface of the cavity.

8. A substrate with built-in electronic component, comprising:
    a component storage layer including an electronic component, and a cover portion having an insulating property and a core material in which a cavity for storing the electronic component and the cover portion is formed, the electronic component including a terminal surface and a main body, the cover portion including a first surface which is flush with the terminal surface, covering the main body of the electronic component, and being made of a first resin material containing an insulating filler at a first content; and
    a first buildup layer and a second buildup layer each including an insulating layer and a via portion, the insulating layer being formed to come into close contact with the cover portion and being made of a second resin material containing an insulating filler at a second content smaller than the first content, the via portion being provided in the insulating layer and being connected to the terminal surface, the first buildup layer and the second buildup layer being provided with the component storage layer sandwiched therebetween, the insulating layer of the first buildup layer is formed to come into close contact with the terminal surface and the first surface, the core material includes a second surface which is flush with the terminal surface and the first surface and is made entirely of metal, the second surface entirely comes into close contact with the insulating layer of the first buildup layer, and the main body of the electronic component includes a third surface which faces the insulating layer of the first buildup layer, the third surface being covered by the cover portion, the insulating layer of the first buildup layer includes a first insulating layer being formed on the component storage layer to come into close contact with the terminal surface and the first surface and a second insulating layer being formed on the first insulating layer, the first buildup layer includes a ground wiring being formed between the first insulating layer and the second insulating layer, the via portion of the first buildup layer is provided in the first insulating layer and includes a first via portion being directly connected to the terminal surface and the ground wiring and a second via portion being directly connected to the ground wiring being connected to the first via portion and the second surface, the ground wiring is maintained at ground potential, and the entirety of the core material, the second via portion, the first via portion and the terminal surface being connected to the first via portion are also maintained at ground potential by being electrically connected to the ground wiring.

* * * * *